(12) United States Patent
Van Bommel et al.

(10) Patent No.: US 10,539,296 B2
(45) Date of Patent: Jan. 21, 2020

(54) HIGH-BRIGHTNESS LUMINESCENT-BASED LIGHTING DEVICE

(71) Applicant: SIGNIFY HOLDING B.V., Eindhoven (NL)

(72) Inventors: Ties Van Bommel, Eindhoven (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 103 days.

(21) Appl. No.: 15/565,156

(22) PCT Filed: Mar. 25, 2016

(86) PCT No.: PCT/EP2016/056717
§ 371 (c)(1),
(2) Date: Oct. 7, 2017

(87) PCT Pub. No.: WO2016/162233
PCT Pub. Date: Oct. 13, 2016

(65) Prior Publication Data
US 2018/0106460 A1 Apr. 19, 2018

(30) Foreign Application Priority Data
Apr. 7, 2015 (EP) ..................................... 15162576

(51) Int. Cl.
*F21V 9/08* (2018.01)
*F21V 29/502* (2015.01)
(Continued)

(52) U.S. Cl.
CPC .............. *F21V 9/08* (2013.01); *F21V 29/502* (2015.01); *G02B 6/0003* (2013.01); *B82Y 20/00* (2013.01);
(Continued)

(58) Field of Classification Search
CPC ........ F21V 9/08; F21V 29/502; G02B 6/0003
See application file for complete search history.

(56) References Cited

U.S. PATENT DOCUMENTS

| 3,369,117 A | 2/1968 | Nicolosi |
| 7,981,321 B2 | 7/2011 | Schmidt et al. |
| 2011/0175528 A1 | 7/2011 | Rains et al. |

FOREIGN PATENT DOCUMENTS

| WO | WO199950916 A1 | 10/1999 |
| WO | WO2011092646 A2 | 8/2011 |

OTHER PUBLICATIONS

K. Kyhm, et al., "Gain Dynamics and Excitonic Transition in CdSe Colloidal Quantum Dots"., Optical Materials, vol. 30, No. 1, Jan. 2, 2007, pp. 158-160.

*Primary Examiner* — Joseph L Williams
(74) *Attorney, Agent, or Firm* — Stephen M. Kohen

(57) ABSTRACT

The invention provides a lighting device configured to generate lighting device light, wherein the lighting device light includes an emission band in the visible part of the spectrum which represents at least 80% of the total power (W) of the lighting device light in the visible part of the spectrum, wherein the emission band has a full width half maximum of at maximum 60 nm, and wherein the emission band has a peak maximum (MM3), wherein said emission band includes luminescent material light, wherein the lighting device includes (i) a solid state-based light source, configured to generate light source light having a peak maximum (MX2), and (ii) a luminescent material, configured to convert at least part of the light source light into said luminescent material light, wherein the solid state-based light source is configured to provide said light source light with 0<MM3−MX2<60 nm.

20 Claims, 11 Drawing Sheets

(51) Int. Cl.
*F21V 8/00* (2006.01)
*F21Y 115/30* (2016.01)
*F21Y 115/10* (2016.01)
*B82Y 20/00* (2011.01)

(52) U.S. Cl.
CPC ........ *F21Y 2115/10* (2016.08); *F21Y 2115/30* (2016.08); *Y10S 977/774* (2013.01); *Y10S 977/814* (2013.01); *Y10S 977/815* (2013.01); *Y10S 977/818* (2013.01); *Y10S 977/95* (2013.01); *Y10S 977/951* (2013.01)

HIGH-BRIGHTNESS LUMINESCENT-BASED LIGHTING DEVICE

CROSS-REFERENCE TO PRIOR APPLICATIONS

This application is the U.S. National Phase application under 35 U.S.C. § 371 of International Application No. PCT/EP2016/056717, filed on Mar. 25, 2016, which claims the benefit of European Patent Application No. 15162576.1, filed on Apr. 7, 2015. These applications are hereby incorporated by reference herein.

FIELD OF THE INVENTION

The invention relates to a lighting device, especially for providing colored light. The invention further relates to a lighting apparatus, comprising such lighting device, and optionally further lighting devices, especially configured to provide white light.

BACKGROUND OF THE INVENTION

High intensity light sources are known in the art. U.S. Pat. No. 3,369,117, for instance, describes a miniature high intensity lamp comprising a base, an arm having one end pivotally mounted on said base, said arm comprising telescoping sections whereby the total length of said arm may be varied, a head pivotally connected to the other end of said arm, a light socket in said head adapted to receive a high intensity light therein, hollow reflecting means having inclined side walls defining a comically-shaped reflector having a tapering bore, mounting means for releasably mounting said reflecting means on said head in a first position wherein the smaller end of said tapering bore is nearest said light socket and a second position wherein the enlarged end of said tapering bore is nearest said light socket, and circuit means for selectively connecting said light socket with a source of potential to illuminate a light received in said socket.

K. Kyhm et al., Optical Materials 30 (2007) 158-160 describes gain dynamics and excitonic transitions in CdSe colloidal quantum dots. Degenerate pump-probe experiments were used to investigate the dynamics of the photo-excited excitons of these quantum dots.

SUMMARY OF THE INVENTION

For various applications such as projection, stage lighting and automotive headlamps, it is desirable to have high intensity light sources. Such light sources can be based on laser light or luminescent concentrator based concepts. However, in the case of using lasers, coherence and eye safety is an issue. For that reason it is desirable to convert the laser light to other wavelengths and/or to light with less coherence with a converter. However, during the conversion large amount of heat may be produced in a small volume which leads to a temperature rise of the converter. In the same way luminescent concentrator based light sources need to be cooled effectively in order to avoid thermal quenching. As a result of cooling surfaces the efficiency is reduced considerably.

Hence, it is an aspect of the invention to provide an alternative lighting device, which preferably further at least partly obviates one or more of above-described drawbacks. Such lighting device can be part of a larger apparatus. Hence, it is also an aspect of the invention to provide an alternative lighting apparatus comprising such lighting device, which preferably further at least partly obviates one or more of above-described drawbacks.

Herein, we suggest amongst others using narrow band emitters and pump these at a wavelength which leads to a low Stokes-shift related energy loss and hence a low temperature increase. For this purpose, materials, such as quantum dots (QDs), can be used.

Especially, the excitation and/or emission spectral bands have full width half maximum (FWHM) of especially at maximum 80 nm, even more especially at maximum 60 nm, and yet even more especially at maximum 30 nm, such as at maximum 20 nm, like at maximum 5 nm. Especially such narrow bands appear to be most efficient in the present lighting device wherein excitation may be done at a wavelength close to the emission wavelength. Especially, the difference in excitation wavelength and peak maximum of the emission band is equal to or below about 80 nm, such as at maximum 60 nm, more especially equal to or below about 50 nm, even more especially at maximum 30 nm, such as especially not more than about 20 nm. However, in a specific embodiment, the difference in excitation wavelength and peak maximum of the emission band may be at least 5 nm. In this way, the Stokes-shift related energy loss is relatively low. For instance, when exciting with UV radiation a luminescent material emitting in the visible, the Stokes-shift related energy loss is high (with the Stokes-shift related energy loss being higher for e.g. red light than for green light, and being higher for green light than for blue light).

Stokes-shift related energy loss is defined as going from a first wavelength $\lambda_1$ (excitation wavelength) to a second wavelength $\lambda_2$ (emission wavelength) (assuming quantum yield of conversion is 100%) is given by $h*c*(1/\lambda_1-1/\lambda_2)$ for a line emitter where c is the speed of light and h is Planck's constant. However in the case of a broad band emitter Stokes-shift, related energy losses are defined as the difference between the energy under the absorbed wavelength range $(E_a)$ and the energy in the emitted light $(E_e)=(E_a-E_e)$ (assuming that the quantum efficiency is 1). In order to have small stokes shift related energy loss, it is desirable to have a luminescent material emitting a narrow band of light which is excited by also a narrow band exciting light such as a LED or a laser. Herein, the terms "Stokes-shift related energy loss" or "energy conversion loss" is used, which is defined as the energy emitted relative to the energy used for excitation. The Stokes-shift related energy loss is especially not more than 13%, more especially not more than 8%, and even more especially at maximum 5%. Hence, especially the spectral overlap between the emitted light spectrum and the spectrum of light used to excite (excitation light) it must be kept to minimum. For instance, the spectral overlap for a normalized emission band and a normalized excitation band may be not more than 25% of the emission band.

Further, the Stokes shift of the luminescent material in wavelength between emission of the narrow emitter and its corresponding lowest excitation band is especially below about 60 nm, more especially below about 50 nm, even more especially at maximum 30 nm, such as especially not more than about 20 nm. The Stokes shift and full width half maximum indicated herein are the values obtained at 20° C. The Stokes shift of the luminescent material is defined as the difference in peak maximum of the emission band and the lowest excitation band (the corresponding excitation band). Especially, this Stokes shift is larger than 0 nm, such as at least 5 nm. Although line emitters may be used, in an embodiment especially no line emitters are applied (such as f-f transition emitters (like several trivalent lanthanides).

Further herein, these wavelength differences, such as the Stokes shift, may further be indicated with the wavenumber or reciprocal cm unit "cm$^{-1}$". For instance, the difference in wavenumbers between by way of example 600 nm and 650 nm, is defined as the difference between 16667 cm$^{-1}$ and 15385 cm$^{-1}$, which is 1282 cm$^{-1}$. In yet another instance, assuming the difference, such as a Stokes shift, in wavenumbers between by way of example 450 nm and 470 nm, this would be defined as the difference between 22222 cm$^{-1}$ and 21277 cm$^{-1}$, which is 945 cm$^{-1}$.

Hence, in a first aspect the invention provides a lighting device ("device") configured to generate lighting device light ("device light"), wherein the lighting device light includes an emission band in the visible part of the spectrum, which represents especially at least 80% of the total power (W) of the lighting device light in the visible part of the spectrum, wherein the emission band has a full width half maximum (FWHM) of especially at maximum 60 nm, such as at maximum 30 nm, and wherein the emission band has a peak maximum (MM3), wherein said emission band comprises luminescent material light, wherein the lighting device comprises (i) a solid state-based light source, configured to generate light source light having a peak maximum (MX2), and (ii) a luminescent material, configured to convert at least part of the light source light into said luminescent material light (herein also indicated as "luminescent material emission"), wherein the solid state-based light source is configured to provide said light source light with especially 0<MM3−MX2≤60 nm, even more especially 0<MM3−MX2≤30 nm, such as being at least 5 nm.

Alternatively, or additionally, the emission band is defined as having full width half maximum (FWHM) of at maximum 1500 cm$^{-1}$.

Further, especially the luminescent material is a small-Stokes shift material (see also above) having a Stokes shift of the luminescent material light and a corresponding lowest energy excitation band (further also simply indicated as "excitation band") of especially at maximum 60 nm. Alternatively or additionally, the luminescent material is a small-Stokes shift material having a Stokes shift of the luminescent material light and a corresponding lowest energy excitation band of at maximum 1500 cm$^{-1}$. Especially, the luminescent material has a Stokes shift (SS), defined as the difference of a peak maximum (MX1) of the lowest excitation band and the peak maximum (MM3) of the corresponding emission band MM3, wherein 0<MM3−MX1≤60 nm.

With such a lighting device, a high intensity light source may be provided, without a high energy loss, and thus without potential thermal problems. Further, with such lighting device it is possible to safely use the high intensity coherent laser light (see also below) in an efficient way, while reducing the risks of the laser light, as the converted light (luminescent material light) is applied. Further, as a result of the relative low Stokes shift, less than about 13% of the energy is lost as a result of Stokes-shift related power loss (see also below). Hence, especially the difference in wavelength between the light source light maximum (i.e. peak) and the emission maximum (i.e. peak) is equal to or less than 80 nm. Especially, the solid state-based light source is configured to provide said light source light with especially 0<MM3−MX2≤60 nm, even more especially 0<MM3−MX2≤30 nm, such as being at least 5 nm (5 nm<MM3−MX2≤30 nm). Hence, the solid state-based light source and the luminescent material are selected such, that these conditions can be met. Alternatively, the solid state-based light source is configured to provide said light source light with especially 0<MM3−MX2≤2500 cm$^{-1}$, especially 0<MM3−MX2≤2000 cm$^{-1}$, even more especially 0<MM3−MX2≤1500 cm$^{-1}$.

Especially, a high intensity light source is applied. Herein solid state-based light sources are applied, such as a LED or laser diode. The term "light source" may also relate to a plurality of light sources, such as 2 to 100 (solid state) multiple LED light sources. Hence, the term LED may also refer to a plurality of LEDs. Especially a laser may be applied. However, also a luminescent concentrator may be applied as light source (note however that the light source may also be applied in combination with a luminescent concentrator; see also below). Hence, the term "solid state-based light source" refers to a light source comprising a solid state light source and optional further components like one or more of a filter, frequency doubling unit, luminescent concentrator, a dye converter, etc. etc.

In a specific embodiment, the lighting device comprises a converter comprising said luminescent material, wherein the converter comprises a converter surface wherein the solid state-based light source is configured to provide said light source light to said converter surface. Especially, the solid state-based light source is configured to provide said light source light to said converter surface with a power which leads to irradiance on the illuminated surface of the convertor of at least 1 W/cm$^2$, such as at least 5 W/cm$^2$, even more especially at least 10 W/cm$^2$, yet more especially at least 25 W/cm$^2$. These values apply to especially concentrator type of light sources. The irradiance of illumination can be even higher when a small luminescent material is illuminated by a laser in that case the irradiance can be 1000 W/cm$^2$ or even higher. The converter may be a luminescent material per se. In yet another embodiment, the converter comprises a matrix wherein the luminescent material is embedded (such as dispersed). In yet a further embodiment, the solid state-based light source and said luminescent material are selected to provide said luminescent material light with an energy conversion loss (Stokes shift related energy loss) of at maximum 13%, such as at maximum 10%. This may lead to a relative high intensity output of the converter.

Hence, in a specific embodiment the lighting device is configured to provide said lighting device light with a radiance of at least 2 W/(sr·mm$^2$). The unit "sr" refers to steradian (solid angle). Also even higher radiance may be achieved, such as at least 5 W/(sr·mm$^2$) to the luminescent material, such as in the range of 5 to 50 W/(sr·mm$^2$). The solid state-based light source light and the luminescent material light are thus effectively "Stokes shifted" with about the same Stokes shift as the excitation and the emission of the luminescent material. Hence, especially the solid state based light source is configured to provide light source light that has a spectral distribution in the visible that substantially entirely is overlapped by the excitation band (of the luminescent material). In other words, the full width half maximum of the solid state-based light source light is equal to, or especially smaller than the excitation full width half maximum. Therefore, in an embodiment the solid state-based light source especially comprises a laser.

The invention may especially be beneficial in combination with a luminescent concentrator (wherein the luminescent concentrator is configured to receive the solid state-based light source light) and/or a small area phosphor (wherein the small area phosphor is configured to receive the solid state-based light source light). In such applications, control of temperature and/or coherence related issues may be relevant. The luminescent concentrator may include the above indicated surface.

Hence, in an embodiment the lighting device further comprises a luminescent concentrator comprising the luminescent material. In a specific embodiment the luminescent concentrator is an elongated luminescent concentrator having a first face and a second face defining a length (L) of the elongated luminescent concentrator, the elongated luminescent concentrator comprising one or more radiation input faces and a radiation exit window, wherein the second face comprises said radiation exit window, wherein the plurality of solid state light sources are configured to provide (blue) light source light to the one or more radiation input faces. In this way, a high brightness source may be generated. In a further embodiment, the lighting device may further comprise an optical reflector configured downstream of the first face and configured to reflect light back into the elongated luminescent concentrator, wherein the radiation exit window is configured perpendicular to the one or more radiation input faces. This may further enhance the out-coupling of the light. In yet another embodiment the elongated luminescent concentrator may comprise a geometrical concentration factor, defined as the ratio of the area of the radiation input faces and the area of the radiation exit window, of at least 2. A factor larger than 1, especially 2 or larger, or even much larger, may provide high brightness sources, which may be applied amongst others also for projector purposes or other purposes. Yet, in another embodiment the lighting device may further comprise a collimator configured downstream of the radiation exit window and configured to collimate the converter light.

The luminescent concentrator may have any shape, such as beam like or rod like. However, the luminescent concentrator may also be disk like, etc. The invention is not limited to specific embodiments of shapes, neither is the invention limited to embodiments with a single exit window or out-coupling face. Below, some specific embodiments are described in more detail. Would the luminescent concentrator have a circular cross-section, then the width and height may be equal (and may be defined as diameter).

In a specific embodiment, the luminescent concentrator may especially have an aspect ratio larger than 1, i.e. the length is larger than the width. In general, the luminescent concentrator is a rod or bar (beam), though the luminescent concentrator does not necessarily have a square, rectangular or round cross-section. In general, the light source is configured to irradiate one of the longer faces (side edge), herein indicated as radiation input face, and radiation escapes from a face at a front (front edge), herein indicated as radiation exit window. Especially, in embodiments the solid state light source, or other light source, is not in physical contact with the luminescent concentrator. Physical contact may lead to undesired out-coupling and thus a reduction in concentrator efficiency. Further, in general the luminescent concentrator comprises two substantially parallel faces, the radiation input face and opposite thereof the opposite face. These two faces define herein the width of the luminescent concentrator. In general, the length of these faces defines the length of the luminescent concentrator. However, as indicated above, and also below, the luminescent concentrator may have any shape, and may also include combinations of shapes. Especially, the radiation input face has an radiation input face area (A), wherein the radiation exit window has a radiation exit window area (E), and wherein the radiation input face area (A) is at least 1.5 times, even more especially at least two times larger than the radiation exit window area (E), especially at least 5 times larger, such as in the range of 2 to 50,000, especially 5 to 5,000 times larger. Hence, especially the elongated luminescent concentrator comprises a geometrical concentration factor, defined as the ratio of the area of the radiation input faces and the area of the radiation exit window, of at least 1.5, such as at least 2, like at least 5, or much larger (see above). This allows e.g. the use of a plurality of solid state light sources (see also below). Especially, the radiation exit window has a radiation exit window area (E) selected from the range of 1 to 100 mm$^2$. With such dimensions, the emissive surface can be small, whereas nevertheless high intensity may be achieved. As indicated above, the luminescent concentrator in general has an aspect ratio (of length/width). This allows a small radiation exit surface, but a large radiation input surface, e.g. irradiated with a plurality of solid state light sources. In a specific embodiment, the luminescent concentrator has a width (W) selected from the range of 0.5 to 100 mm. The luminescent concentrator is thus especially an integral body, having the herein indicated faces. The converter surface may thus include the radiation input surface.

The generally rod shaped or bar shaped luminescent concentrator can have any cross sectional shape, but in embodiments has a cross section the shape of a square, rectangle, round, oval, triangle, pentagon, or hexagon. Generally the concentrator bodies are cuboid, but may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a luminescent concentrator having a round cross section. Hence, in embodiments the elongated luminescent concentrator further has a width (W) and a height (H), with especially L>W and L>H. Especially, the first face and the second face define the length, i.e. the distance between these faces is the length of the elongated luminescent concentrator. These faces may especially be arranged parallel.

The luminescent concentrator may also be a cylindrically shaped rod. In embodiments the cylindrically shaped rod has one flattened surface along the longitudinal direction of the rod and at which the light sources may be positioned for efficient in-coupling of light emitted by the light sources into the luminescent concentrator. The flattened surface may also be used for placing heat sinks. The cylindrical luminescent concentrator may also have two flattened surfaces, for example located opposite to each other or positioned perpendicular to each other. In embodiments the flattened surface extends along a part of the longitudinal direction of the cylindrical rod.

The luminescent concentrator as set forth below in embodiments according to the invention may also be folded, bended and/or shaped in the length direction such that the luminescent concentrator is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact luminescent concentrator of which the total length, along which generally the light is guided, is relatively large, leading to a relatively high lumen output, but can at the same time be arranged into a relatively small space. For example luminescent parts of the luminescent concentrator may be rigid while transparent parts of the luminescent concentrator are flexible to provide for the shaping of the luminescent concentrator along its length direction. The light sources may be placed anywhere along the length of the folded, bended and/or shaped luminescent concentrator.

Parts of the luminescent concentrator that are not used as light in-coupling area or light exit window may be provided with a reflector. Hence, in an embodiment the lighting device further comprises a reflector configured to reflect luminescent material light back into the luminescent concentrator. Therefore, the lighting device may further include one or more reflectors, especially configured to reflect radiation back into the luminescent concentrator that escapes from one or more other faces than the radiation exit window. Especially, a face opposite of the radiation exit window may include such reflector, though in an embodiment not in physical contact therewith. Hence, the reflectors may especially not be in physical contact with the luminescent concentrator. Therefore, in an embodiment the lighting device further comprises an optical reflector (at least) configured downstream of the first face and configured to reflect light back into the elongated luminescent concentrator. Alternatively or additionally, optical reflectors may also be arranged at other faces and/or parts of faces that are not used to couple light source light in or luminescence light out. Especially, such optical reflectors may not be in physical contact with the luminescent concentrator. Further, such optical reflector(s) may be configured to reflect one or more of the luminescence and light source light back into the luminescent concentrator. Hence, substantially all light source light may be reserved for conversion by the luminescent material (i.e. the activator element(s) such as especially $Ce^{3+}$) and a substantial part of the luminescence may be reserved for out-coupling from the radiation exit window. The term "reflector" may also refer to a plurality of reflectors.

Especially for automotive applications, the light source may comprises a light emitting surface comprising a light emitting surface area (AL), wherein the luminescent concentrator comprises a radiation input surface comprising a luminescent concentrator surface area (A) and a radiation exit window comprising a radiation exit window area (E), wherein $0.8 \leq A/AL \leq 1.2$ and wherein $0.8 \leq E/AL \leq 1.5$, especially $1 \leq E/AL \leq 1.5$.

The terms "coupling in" and similar terms and "coupling out" and similar terms indicate that light changes from medium (external from the luminescent concentrator into the luminescent concentrator, and vice versa, respectively). In general, the light exit window will be a face (or a part of a face), configured (substantially) perpendicular to one or more other faces of the waveguide. In general, the luminescent concentrator will include one or more body axes (such as a length axis, a width axis or a height axis), with the exit window being configured (substantially) perpendicular to such axis. Hence, in general, the light input face(s) will be configured (substantially) perpendicular to the light exit window. Thus, the radiation exit window is especially configured perpendicular to the one or more radiation input faces. Therefore, especially the face comprising the light exit window does not comprise a light input face.

Downstream of the radiation exit window, optionally an optical filter may be configured.

In yet a further embodiment, the lighting device further comprises a collimator configured downstream of the radiation exit window and configured to collimate the converter light. Such collimator, like e.g. a CPC (compound parabolic concentrator), may be used to collimate the light escaping from the radiation exit window and to provide a collimated beam of light.

The above embodiments in relation to a luminescent concentrator thus especially apply to the luminescent concentrator configured downstream from the solid state-based light source. However, optionally these embodiments may also apply to a luminescent concentrator comprised by the solid state-based light source. However, the solid state-based light source my not necessarily include a luminescent concentrator, but may also include e.g. (only) a laser (see also above).

Further, the lighting device may include a heat sink configured to facilitate cooling of the solid state light source and/or luminescent concentrator. The heat sink may comprise or consist of copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. The lighting device may further include one or more cooling elements configured to cool the luminescent concentrator.

As indicated above, the invention may also be applied for illuminating a small area phosphor. Therefore, in a further embodiment the lighting device comprises a spot of luminescent material, wherein the spot has an area of at maximum 4 $mm^2$, such as at maximum 1 $mm^2$. Examples of such small area or small spot phosphors are e.g. at maximum 0.25 $mm^2$, such as especially at maximum 0.04 $mm^2$, like even more especially at maximum 0.01 $mm^2$. A minimum area may be in the range of e.g. about 0.001 $mm^2$. Small area phosphors may e.g. be used for coupling light into a light fiber, e.g. for automotive applications. The area that is illuminated with the light source light may thus also be indicated as converter surface.

The invention especially uses luminescent materials ("phosphors") that have a small Stoke shift. The Stokes shift is especially defined as the difference (in wavelength or frequency units) between positions of the band maxima of the absorption and emission spectra of the same electronic transition (see also above).

Suitable materials that can be used are lanthanides having 4f transitions wherein substantially all excitation in a 4f energy level leads to an emission at the same wavelength as the excitation wavelength (Stokes shift is virtually zero). Other suitable luminescent materials are for instance quantum dots and organic dyes.

Hence, in an embodiment luminescent material comprises luminescent quantum dots. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. This means that by using quantum dots any spectrum can be obtained as they are narrow band emitters.

Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots.

The quantum dots or luminescent nanoparticles, which are herein indicated as light converter nanoparticles, may for instance comprise group II-VI compound semiconductor quantum dots or luminescent quantum dots based on one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be based on group III-V compound semiconductor quantum dots selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be based on I-III-VI2 chalcopyrite-type semiconductor quantum dots selected from the group consisting of $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be based on I-V-VI2 semiconductor quantum dots, such as selected from the group consisting of $LiAsSe_2$, $NaAsSe_2$ and $KAsSe_2$. In yet a further embodiment, the luminescent nanoparticles may for instance be based on a group IV-VI compound semiconductor nano crystals such as SbTe. In a specific embodiment, the luminescent nanoparticles are based on one or more of InP, $CuInS_2$, $CuInSe_2$, CdTe, CdSe, CdSeTe, $AgInS_2$ and $AgInSe_2$. In yet a further embodiment, the luminescent nanoparticles may for instance be based on one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiment, Cd-free QDs are applied. In a specific embodiment, the light converter nano-particles comprise III-V QDs, more specifically an InP based quantum dots, such as a core-shell InP—ZnS QDs. Note that the terms "InP quantum dot" or "InP based quantum dot" and similar terms may relate to "bare" InP QDs, but also to core-shell InP QDs, with a shell on the InP core, such as a core-shell InP—ZnS QDs, like a InP—ZnS QDs dot-in-rod.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. For instance, core-shell particles and dots-in-rods may be applied and/or combinations of two or more of the afore-mentioned nano particles may be applied, such as CdS and CdSe. Here, the term "different types" may relate to different geometries as well as to different types of semiconductor luminescent material. Hence, a combination of two or more of (the above indicated) quantum dots or luminescent nano-particles may also be applied. Hence, in an embodiment the luminescent material comprises luminescent quantum dots based on one or more of CdSe and CdS.

One example, such as derived from WO 2011/031871, of a method of manufacturing a semiconductor nanocrystal is a colloidal growth process.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific light converter nanoparticles, based on semiconductors.

Therefore, in a specific embodiment, the light converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

In general, the cores and shells comprise the same class of material, but essentially consist of different materials, like a ZnS shell surrounding a CdSe core, etc.

In a specific embodiment the luminescent quantum dots are selected from the group consisting of InP, CuInS$_2$ and AgInS$_2$ type quantum dots.

The luminescent material, or especially the luminescent concentrator or the small area phosphor, is configured to convert at least part of the light source light. In other words, one may say that the light source is radiationally coupled to the luminescent material. The term "radiationally coupled" especially means that the light source and the luminescent material, here the luminescent material, are associated with each other so that at least part of the radiation emitted by the light source is received by the luminescent material (and at least partly converted into luminescence). The luminescent material may be configured at a non-zero distance from the light source, or may be in physical contact. The former embodiment is sometimes also indicated as vicinity or remote, with the former closer and the latter further away from the light source. Herein, in an embodiment the light source comprises a light emitting surface configured at a distance of equal to or less than 1 mm from the luminescent material. Hence, especially the distance is relatively small, or even zero. Hence, in yet a further embodiment the light source comprises a light emitting surface in physical contact with the luminescent material.

As indicated above, the lighting device light includes an emission band in the visible part of the spectrum which represents at least 80% of the total power (W) of the lighting device light in the visible part of the spectrum, especially at least 90% of the total power of the lighting device light in the visible part of the spectrum. Hence, the lighting device is substantially monochromatic, as also the (emission) band is relatively narrow. It is not excluded that the lighting device may also emit in the UV or in the IR. Especially however, at least 60%, more especially at least 80%, of the total power emitted (by the lighting device) as radiation in the UV, and visible is comprised by this emission band in the visible. Yet more especially, at least 60%, more especially at least 80%, of the total power emitted as radiation in the UV, IR and visible is comprised by this emission band in the visible. Hence, the lighting device is substantially monochromatic.

Therefore, a colored lighting device light is provided, being e.g. violet, blue, blue green, green, yellow, orange, or red. The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570 to 590 nm. The terms "orange light" or "orange emission" especially relate to light having a wavelength in the range of about 590 to 620 nm. The terms "red light" or "red emission" especially relate to light having a wavelength in the range of about 620 to 780 nm. The term "pink light" or "pink emission" refers to light having a blue and a red component. The terms "visible", "visible light" or "visible emission" refer to light having a wavelength in the range of about 380 to 780 nm.

Hence, as indicated above, the emission band has in embodiments a full width half maximum (FWHM) of at maximum 1500 cm$^{-1}$, especially at maximum 1000 cm$^{-1}$. The luminescent material is especially a small-Stokes shift material having a Stokes shift of the luminescent material light and a corresponding lowest energy excitation band (EX) of at maximum 1500 cm$^{-1}$, such as at maximum. In an embodiment, such as in the case of quantum dots, the Stokes shift may be larger than 0 cm$^{-1}$. As further indicated above, the excitation band especially entirely overlaps the light source light emission band.

The invention also provides in a further aspect a lighting apparatus ("apparatus") comprising the lighting device as defined herein. Such apparatus is thus not necessarily substantially monochromatic, as the apparatus may include further light sources and/or further elements which may change the lighting device light. Hence, in a further embodiment of the lighting apparatus, this apparatus further comprises one or more further lighting devices, wherein the lighting device and the one or more further lighting devices are configured to provide white lighting apparatus light. Especially, the one or more further lighting devices comprise one more lighting devices as defined herein. For instance, lighting devices generating blue, green and red light may be combined. Alternatively or additionally, a lighting device as defined herein generating blue light may be used to illuminate a yellow phosphor.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting. Especially, the lighting device as defined herein or the lighting apparatus according as defined herein may be used in projection lighting, stage lighting or automotive lighting, etc. Hence, one of the applications may be in automotive, such as in head lights of cars, trucks, busses, motors, trains, metros, etc. etc. Hence, in an embodiment the invention also provides an automotive lamp comprising the lighting device as defined herein. The invention further provides a projector comprising the lighting device as defined herein.

The lighting device is (thus) especially an integral device comprising the (solid state) light source and the luminescent material.

Especially, such lighting device may include a light exit window (with the exit window especially comprising a light transmissive solid material), where the light source is configured upstream of the exit window and wherein the luminescent material is configured downstream of the light source. The luminescent material may be configured upstream of the light exit window or may be comprised in the light exit window.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
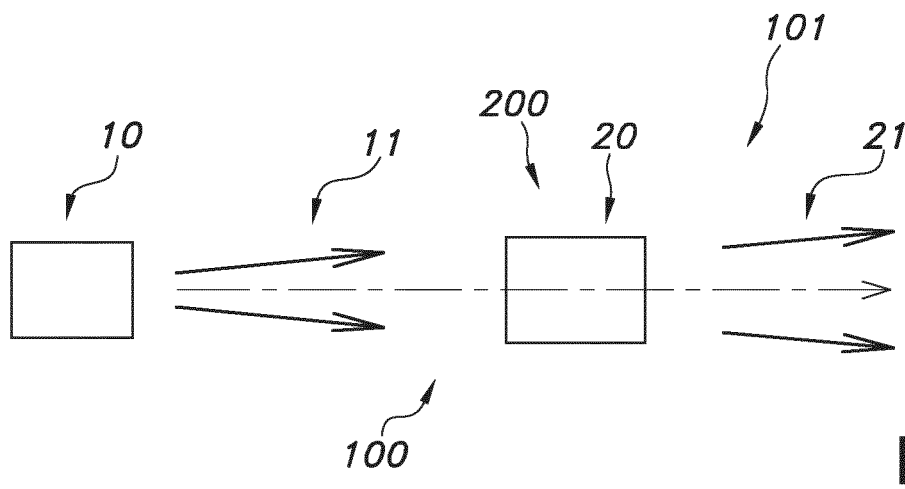
FIGS. 1a-1e schematically depict some aspects of the invention.

FIG. 1a schematically depicts an embodiment of a lighting device 100 configured to generate lighting device light 101. The lighting device 100 comprises a solid state-based light source 10, configured to generate light source light 11, and a luminescent material 20, configured to convert at least part of the light source light 11 into luminescent material light 21. The light downstream of the luminescent material 20 is indicated with reference 101. The light 101 at least comprises the emission or luminescence of the luminescent material 20, i.e. the luminescent material light 21. Optionally, some of the light source light 11 might also be comprised by the lighting device light 101. This may not be a problem, as the wavelength of the light source light and the luminescent material light may be substantially identical.

Especially, the lighting device light 101 substantially consists of the luminescent material light 21, such as 80% or more, such as at least 90% of the power (W) of the emission band may be luminescent material light.

The light source 10 is configured upstream of the luminescent material 20, the luminescent material light 21 emanates downstream from said luminescent material. Especially, herein transmissive configuration are applied. The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream". Here, by way of example a transmissive configuration is depicted. However, as indicated below, also reflective configurations may be chosen.

Figure 1B:
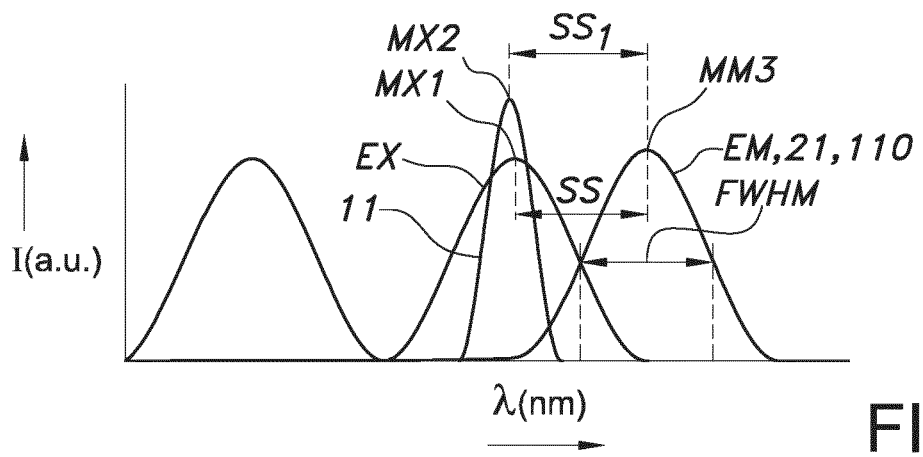
Figure 1C:
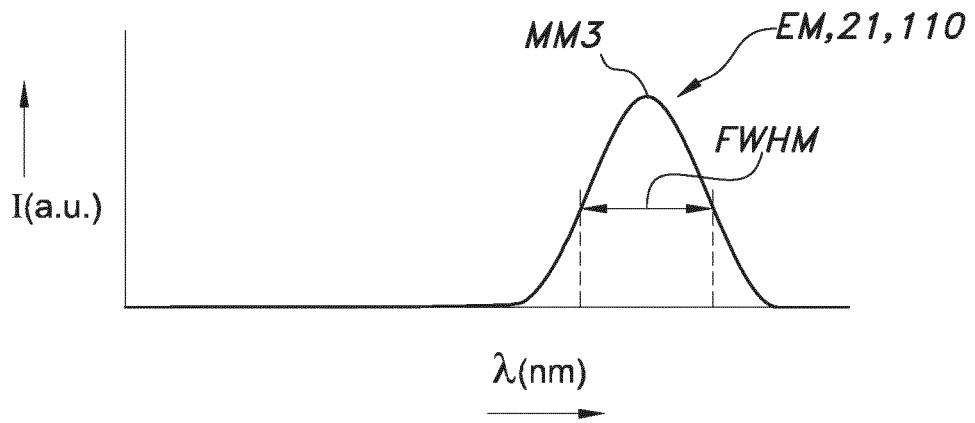

The lighting device light 101 includes an emission band 110 in the visible part of the spectrum, see FIGS. 1b-1c. Especially, this band represents at least 80% of the total power W of the lighting device light 101 in the visible part of the spectrum. The emission band 110 has full width half maximum FWHM of at maximum 1500 cm$^{-1}$. The luminescent material 20 is a small-Stokes shift material having a Stokes shift SS of the luminescent material light 21 and a corresponding lowest energy excitation band EX of at maximum 1500 cm$^{-1}$ (note that here by way of example the excitation spectrum has two excitation maxima; for a calculation of the Stokes shift, the lowest band in energy is chosen, as known in the art). As shown in FIG. 1b, the solid state-based light source 10 is configured to provide the light source light 11 at a wavelength within the lowest energy excitation band EX leading to irradiance of at least 10 W/(cm$^2$) on the luminescent material 20. The emission (band) of the luminescent material is also indicated with reference EM. The difference in peak maximum MM3 of the emission band 21/EM and the peak maximum MX2 of the light source light 11 is indicated with reference SS2. Especially, the difference SS2 is larger than 0 nm, but equal to or smaller than 30 nm. FIG. 1c shows the lighting device light 101, which may thus substantially consist of the luminescent material light 21.

Figure 1D:
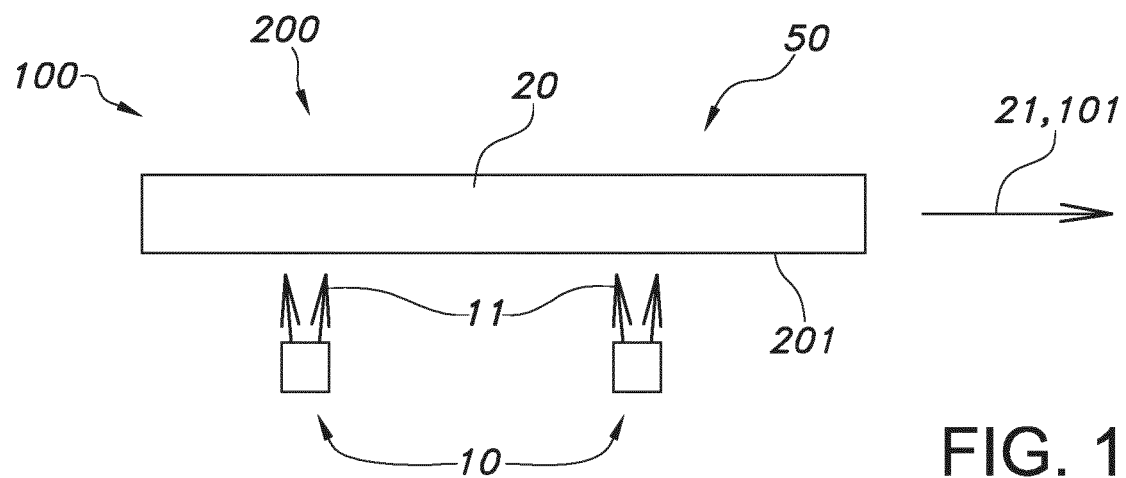
Figure 1E:
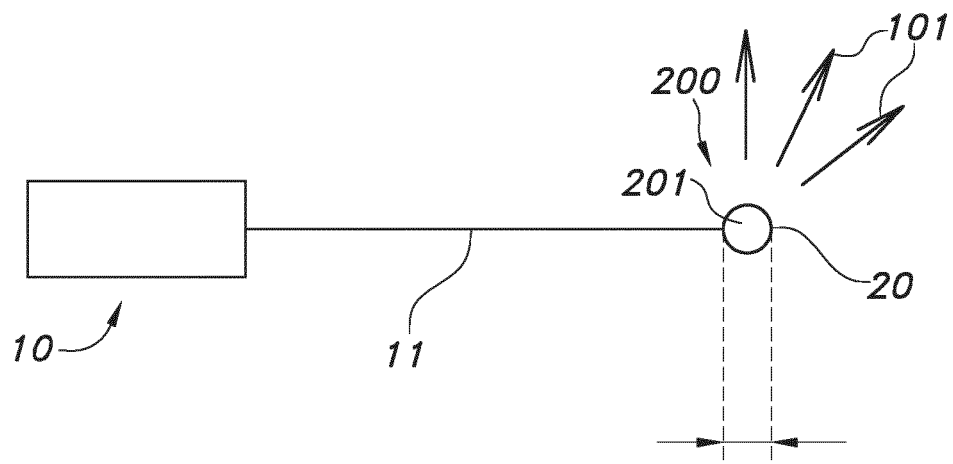

FIG. 1d schematically depicts an embodiment of the lighting device 100 further comprising a luminescent concentrator 50 comprising the luminescent material 20, wherein the light source light 11 enters the concentrator 50 at surface 201 and exits the concentrator at a surface substantially perpendicular to and having a smaller area than the surface 201 thereby providing high intensity light. Embodiments of the luminescent concentrator are described further below. FIG. 1e schematically depicts an embodiment of the lighting device 100 comprising a spot 60 of luminescent material 20, wherein the spot 60 has an area of e.g. at maximum 1 mm$^2$, or even smaller. The dimensions of the spot are by way of example indicated with L/W/D, indicating the length and width, or the diameter, whatever may be applicable. The spot 60 may have any (cross-sectional) shape, such as round, square, rectangular, oval, etc., but especially round (with dimension D), or square (with dimension L=W). Reference 200 indicates a converter 50 comprising luminescent material 20, or the spot 60 of comprising luminescent material 20, and reference 201 indicates a converter surface, i.e. a surface of the converter at which the solid state-based light source may irradiate its light 11.

Figure 2:
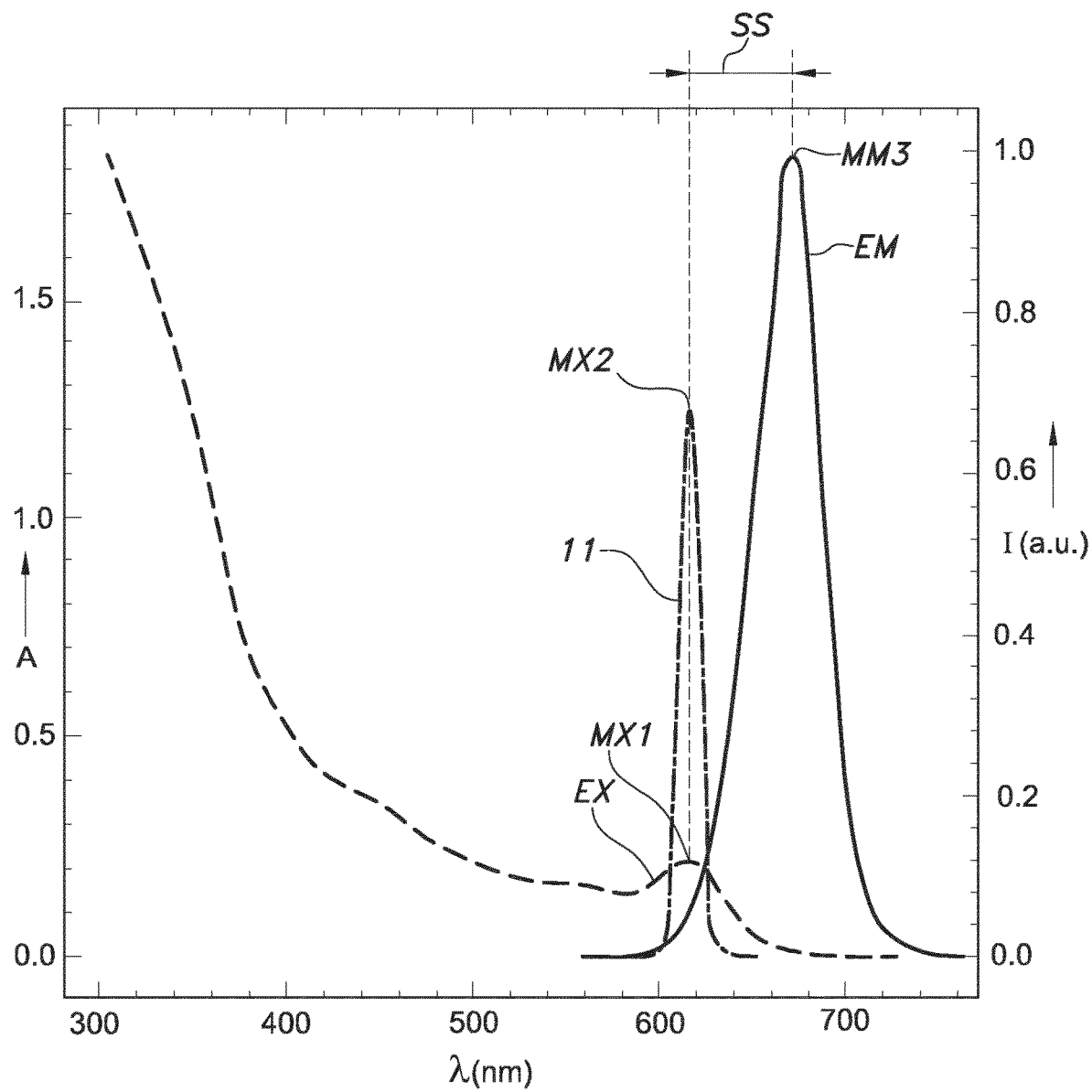
FIG. 2 shows an excitation and an emission spectrum of a quantum dot, including light source light.

FIG. 2 schematically depicts an excitation (EX) and emission (EM) spectrum of a CdSe tetrapod quantum dot emission at about 630 nm (FWHM less than 30 nm), as well as the emission (light source light 11) of a narrow band excitation source at 620 nm. The Stokes shift is indicated with reference SS. As can be seen, the Stokes shift is very small, in the order of only 10 nm, this leads to Stokes-shift related energy loss of 4.5%. Note that in this embodiment the excitation maximum MX1 and the light source light maximum MX2 are chosen to be substantially identical. However, this is not necessarily the case (see also FIG. 1b). For instance, the light source may be configured to excite the luminescent material at a longer wavelength, when desired (i.e. a lower Stokes-shift related energy loss). As shown in this figure, the solid state-based light source is configured to provide said light source light 11 with 0<MM3−MX2≤60 nm.

For various applications such as projection, stage lighting and automotive headlamps it is desirable to have high intensity light sources.

Such light sources can be based on laser light or luminescent concentrator based concepts. However, in the case of using lasers coherence and eye safety is an issue. For that reason it is desirable to convert the laser light to other wavelengths. During the conversion large amount of heat produced is in a small volume which leads to a temperature rise. In the same way luminescent concentrator based light sources need to be cooled effectively in order to avoid thermal quenching. As a result of cooling surfaces the efficiency is reduced considerably.

Here, we suggest (thus) using narrow emitters and pump these at a wavelength which leads to a low Stokes losses minimizing energy loss and hence temperature increase. For this purpose, materials such as quantum dots (QDs) can be used (see also FIG. 2). The shift in wavelength between absorption and emission of the narrow emitter is especially below 20 nm, more especially below 10 nm, and most especially below 5 nm. Here below various specific lighting configurations will be described. The full width half max of a quantum dot is about 20 nm. Thus this QDs can be pumped with e.g. laser diode or LED with a FWHM of typically 2 nm and 20 nm, respectively.

In an embodiment, we suggest a lighting device comprising a laser diode and a phosphor material (see also for instance FIG. 1e). The phosphor material absorbs laser light and emits converted laser light.

Figure 3A:
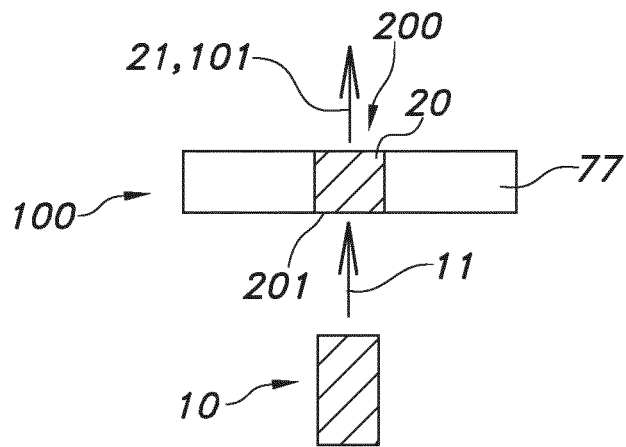
FIGS. 3a-3e schematically depict some aspects of the invention, especially embodiments of the lighting device.
Figure 3B:
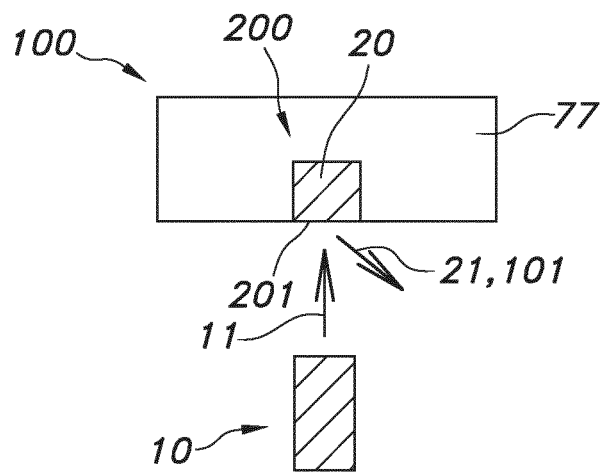
Figure 3C:
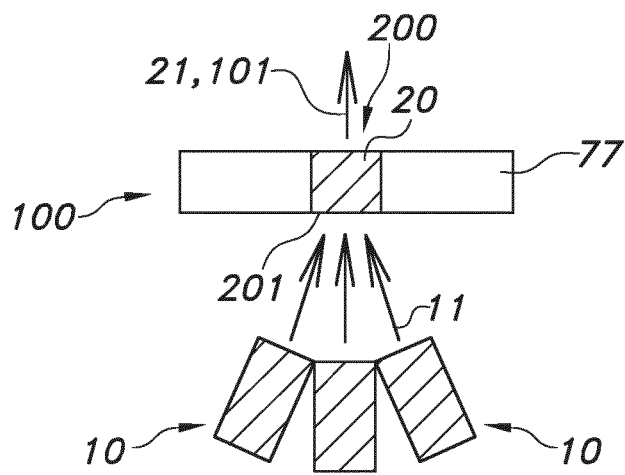

The narrow band emitter may be partly enclosed by a reflective heat sink 77 (FIG. 3a). In another configuration, we suggest the use of the converter 200 with the reflective heat sink 77 in the reflective mode (FIG. 3b). In another embodiment, we suggest the use of multiple lasers (as solid state light sources 10) pumping the same converter 200 (or luminescent element) and with the reflective heat sink 77 (FIG. 3c).

Figure 3D:
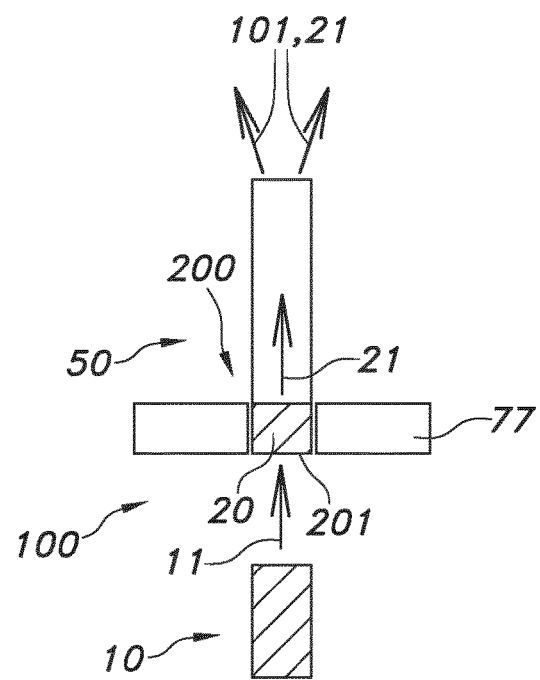

In yet another embodiment, we suggest a laser based lighting device comprising a luminescent material in a light guide. Laser light is pumping the phosphor 20 in the light guide, i.e. a luminescent concentrator. See further also below with respect to a luminescent concentrator. The phosphor is converting at least a part of the light with the first spectral distribution to light with a second spectral distribution, guiding the light with the second spectral distribution to the first light exit surface and coupling the light with the second spectral distribution out of the first light exit surface wherein the luminescent wherein the shift in wavelength between absorption and emission of the narrow emitter is especially below 20 nm, more especially below 10 nm, and most especially below 5 nm (FIG. 3d).

Figure 3E:
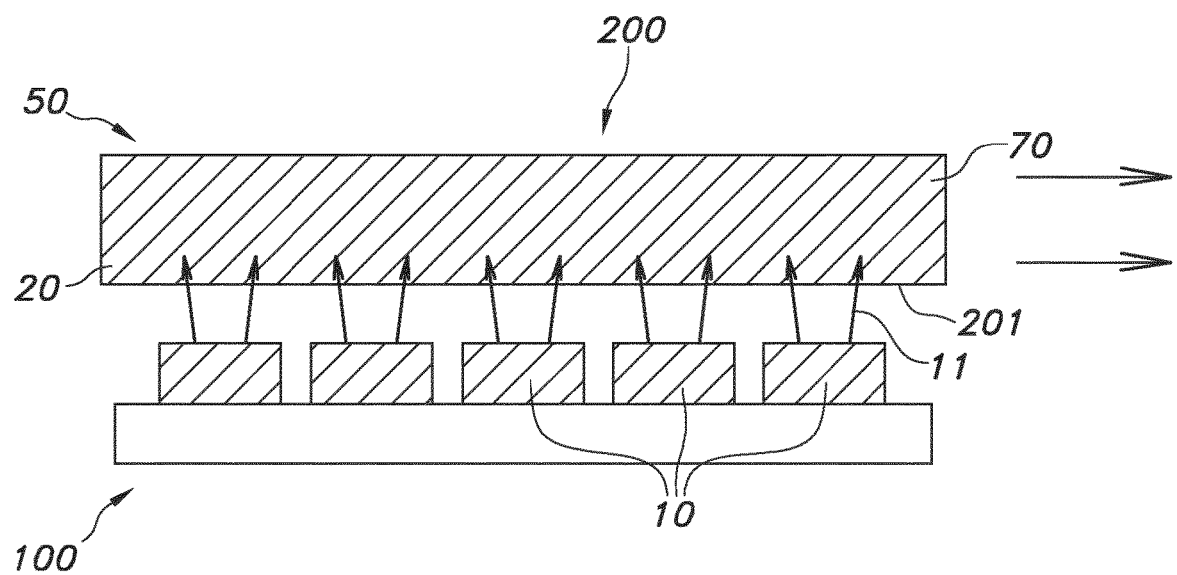

In another embodiment, we suggest a light emitting device comprising a light source adapted for, in operation, emitting light with a first spectral distribution, a first luminescent light guide comprising a first light input surface and a first light exit surface extending at an angle different from zero to one another, and the first luminescent light guide being adapted for receiving the light with the first spectral distribution at the first light input surface, converting at least a part of the light with the first spectral distribution to light with a second spectral distribution, guiding the light with the second spectral distribution to the first light exit surface and coupling the light with the second spectral distribution out of the first light exit surface wherein the luminescent wherein the shift in wavelength between absorption and emission of the narrow emitter is especially below 20 nm, more especially below 10 nm, and most especially below 5 nm (FIG. 3e).

Figure 4A:
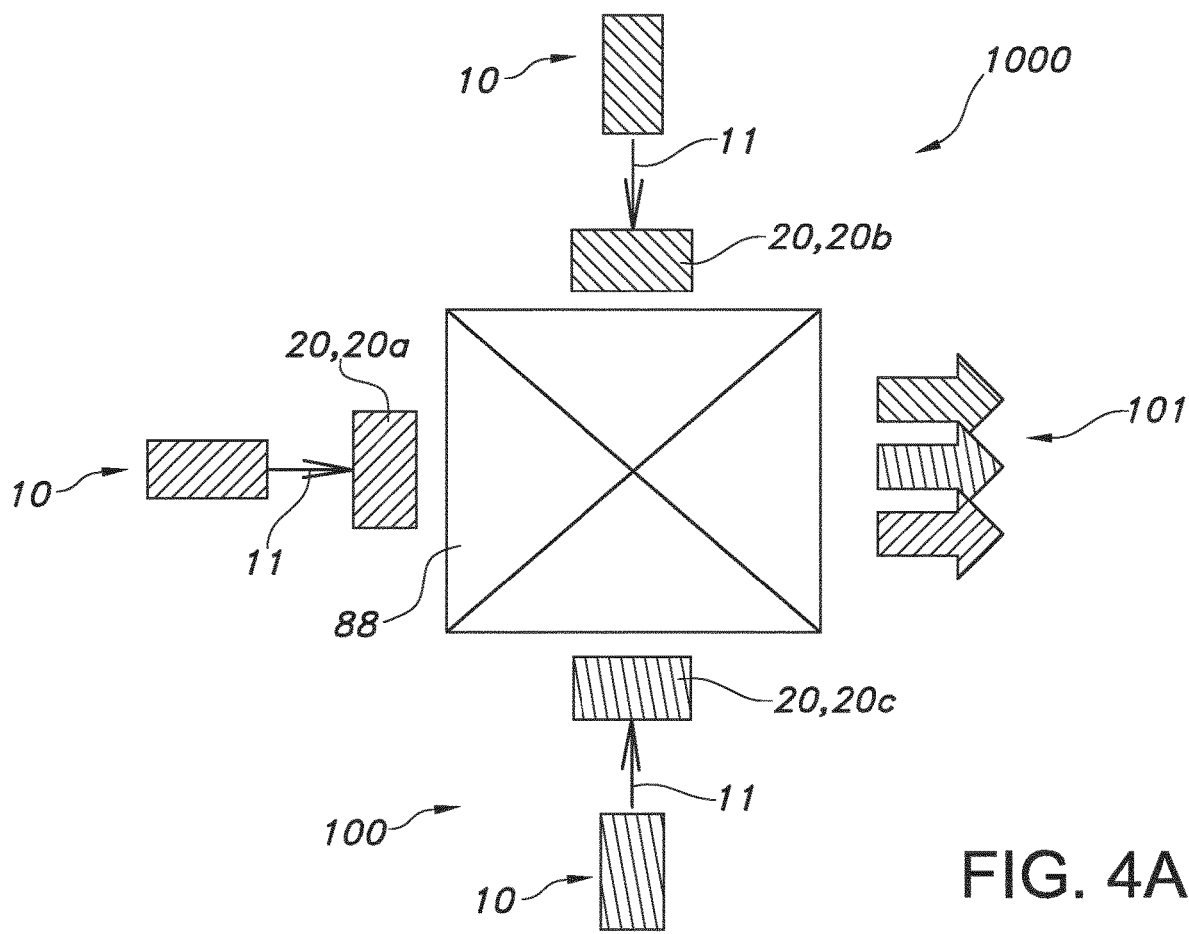
FIGS. 4a-4d schematically depict some aspects of the invention, especially embodiments of the lighting apparatus.

In yet another embodiment, we suggest a lighting device comprising more than one phosphor material and pump the phosphor materials with different lasers to obtain white light (FIG. 4a). This figure schematically depicts an embodiment of a lighting apparatus 1000. References 20a-20c indicate different types of luminescent materials, providing different types of light (see also FIG. 4c). Light generated by the apparatus 1000 is indicated with reference 1001.

Figure 4B:
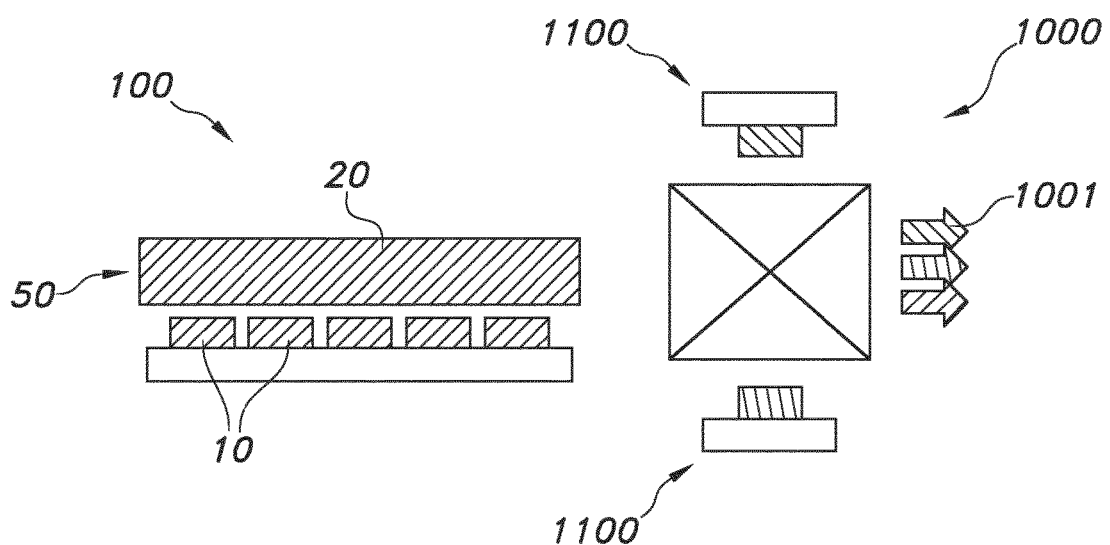

In yet another embodiment, we suggest the use of the light emitting device in combination with other solid state lighting light sources 1100 such as light emitting diodes (LEDs) or laser diodes. In a preferred embodiment, the light emitting device is combined with light sources emitting different colors to obtain white light (FIG. 4b).

Figure 4C:
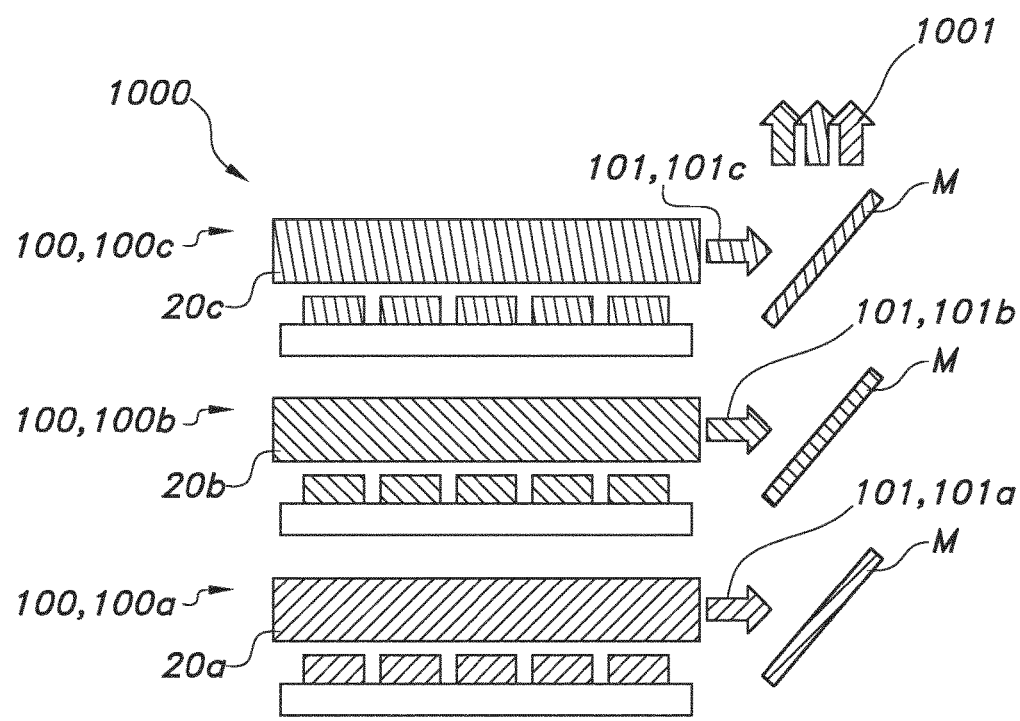
Figure 4D:
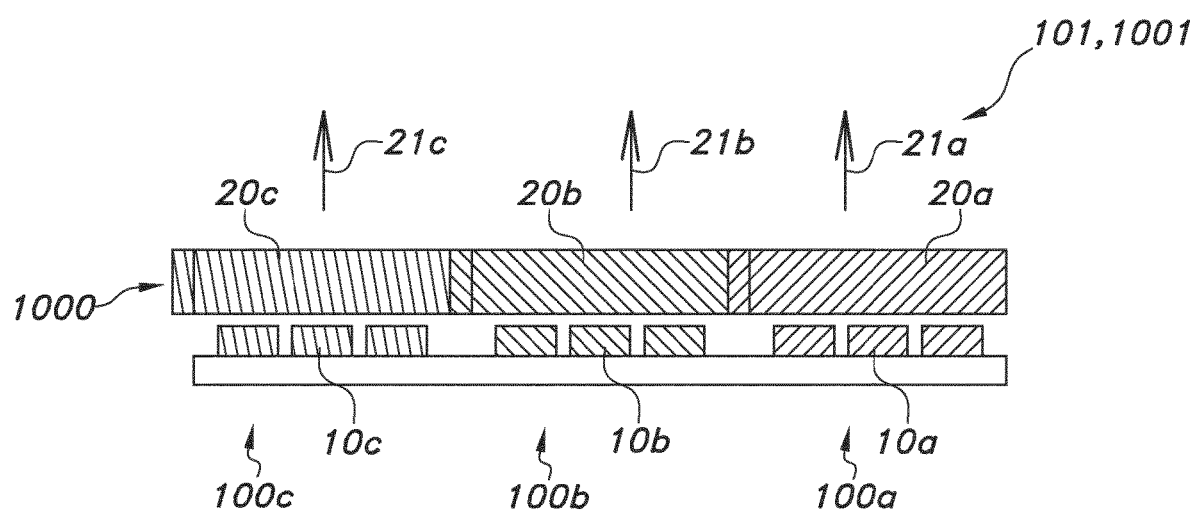

In yet another embodiment, several light emitting devices might be combined (FIG. 4c). In yet another embodiment, several light emitting devices might be combined in series. Light absorption is prevented by adding dichroic mirrors between the luminescent sections (FIG. 4d). References 21a-21c indicate different types of luminescent materials light, provided by different types of luminescent materials 20a-20c, respectively. In FIGS. 4c-4d in fact three lighting device 100 are depicted, indicated with references 100a-100c. Reference M indicates a mirror.

A lamp, a luminaire, and a lighting system comprising a light emitting device as defined herein may be used in one or more of the following applications: digital projection, automotive lighting, stage lighting, shop lighting, home lighting, accent lighting, spot lighting, theater lighting, fiber optic lighting, display systems, warning lighting systems, medical lighting applications, decorative lighting applications. In yet another embodiment, we suggest the use of the lighting device in a lamp, a luminaire or lighting system. In yet another embodiment, we suggest the use of the lighting device in a projector system.

Materials such as quantum dots (QDs) can be used. The shift in wavelength between absorption and emission of the narrow emitter is especially below 20 nm, more especially below 10 nm, and most especially below 5 nm.

Quantum dots (or rods) are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Figure 5A:
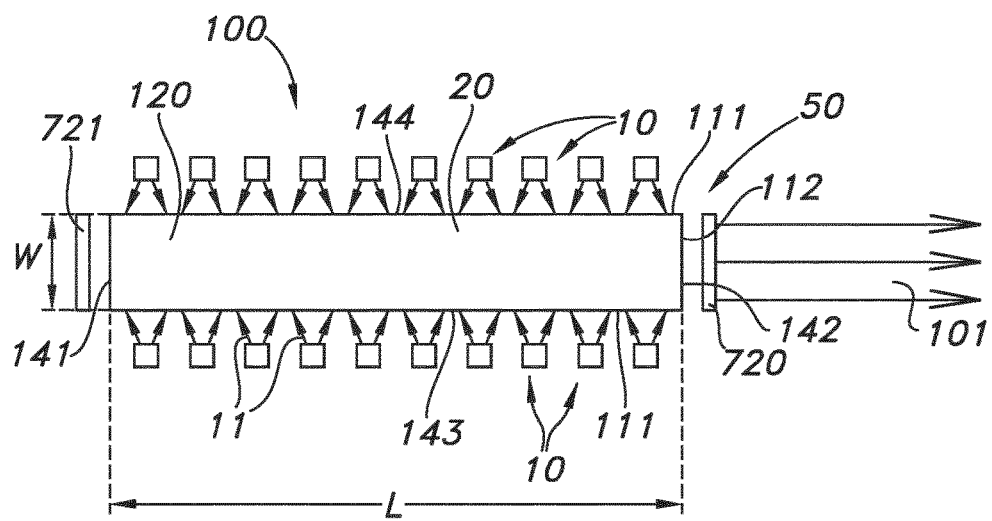
FIGS. 5a-5c schematically depict some further aspects of the invention.

Embodiments of luminescent concentrator are further described below. An embodiment of the luminescent concentrator as defined herein is schematically depicted in FIG. 5a. FIG. 5a schematically depicts a lighting device 100 comprising a plurality of solid state light sources 10 and a luminescent concentrator 50, such as an elongated (ceramic) body having a first face 141 and a second face 142 defining a length L of the (elongated) concentrator body 50. The (elongated) concentrator body 50 comprises one or more radiation input faces 111, here by way of example two oppositely arranged faces, indicated with references 143 and 144 (which define e.g. the width W). Further the concentrator body 50 comprises a radiation exit window 112, wherein the second face 142 comprises said radiation exit window 112. The entire second face 142 may be used or configured as radiation exit window. The plurality of solid state light sources 10 are configured to provide (blue) light source light 11 to the one or more radiation input faces 111. As indicated above, they especially are configured to provide to at least one of the radiation input faces 111 a blue power $W_{opt}$ of in average especially, but not exclusively, at least 0.067 Watt/mm$^2$.

The (elongated) concentrator body 50 may comprises a ceramic material 120 configured to wavelength convert at least part of the (blue) light source light 11 into converter light 101, such as at least one or more of green and red converter light 101. References 720 and 721 indicate an optical filter and a reflector, respectively. The former may reduce e.g. non-green light when green light is desired or may reduce non-red light when red light is desired. The latter may be used to reflect light back into the concentrator body or waveguide, thereby improving the efficiency. Note that more reflectors than the schematically depicted reflector may be used.

The light sources may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these.

Figure 5B:
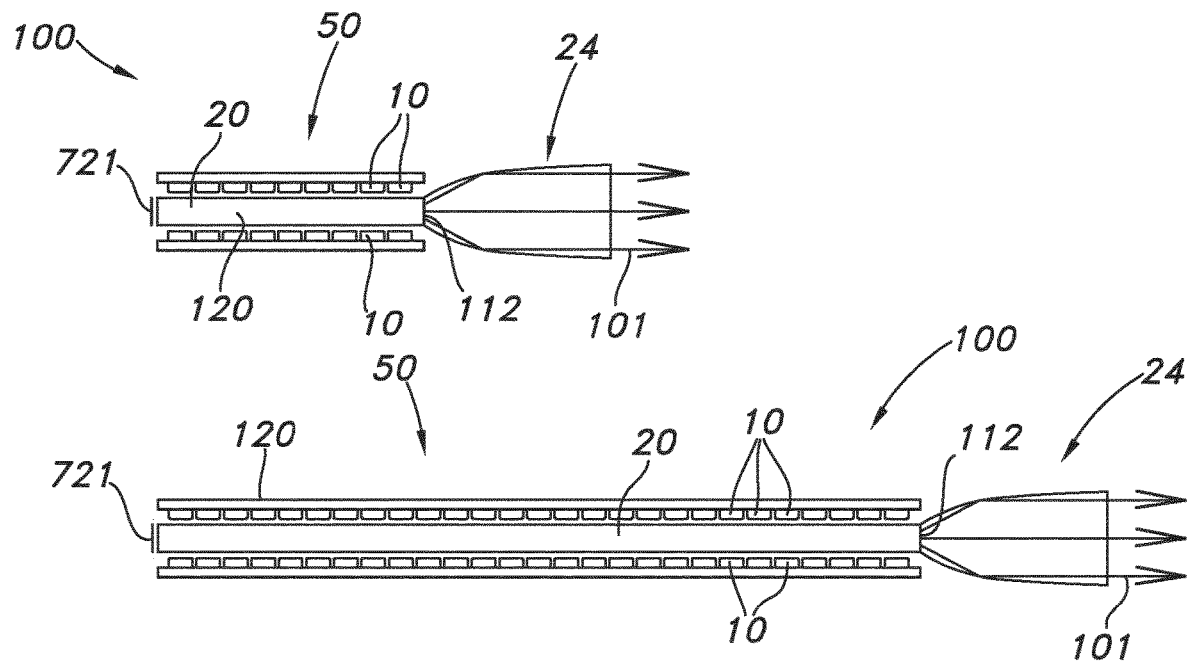

FIGS. 5a-5b schematically depict similar embodiments of the lighting device. Further, the lighting device may include further optical elements, either separate from the waveguide and/or integrated in the waveguide, like e.g. a light concentrating element, such as a compound parabolic light concentrating element (CPC). The lighting devices 1 in FIG. 5b further comprises a collimator 24, such as a CPC.

Figure 5C:
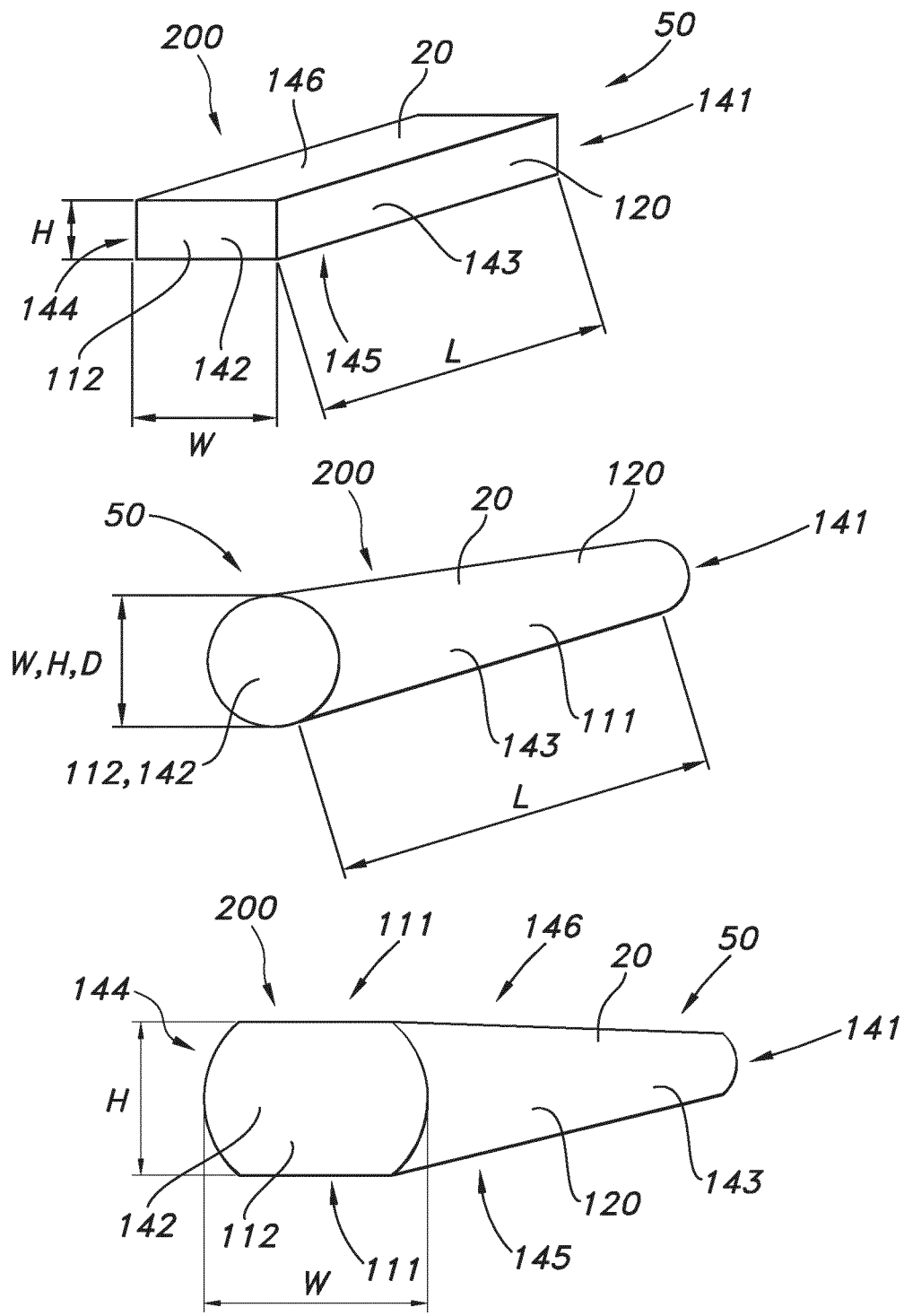

FIG. 5c schematically depicts some embodiments of possible concentrator bodies as waveguides or luminescent concentrators. The faces are indicated with references 141-146. The first variant, a plate-like or beam-like concentrator body has the faces 141-146. Light sources, which are not shown, may be arranged at one or more of the faces 143-146. The second variant is a tubular rod, with first and second faces 141 and 142, and a circumferential face 143. Light sources, not shown, may be arranged at one or more positions around the concentrator body. Such concentrator body will have a (substantially) circular or round cross-section. The third variant is substantially a combination of the two former variants, with two curved and two flat side faces. The variants shown in FIG. 5c are not limitative. More shapes are possible, i.e. for instance referred to WO2006/054203, which is incorporated herein by reference. The concentrator bodies, which are used as light guides, generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. Hence, the aspect ratio (of length/width) is especially larger than 1, such as equal to or larger than 2. Unless indicated otherwise, the term "aspect ratio" refers to the ratio length/width.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Figure 6A:
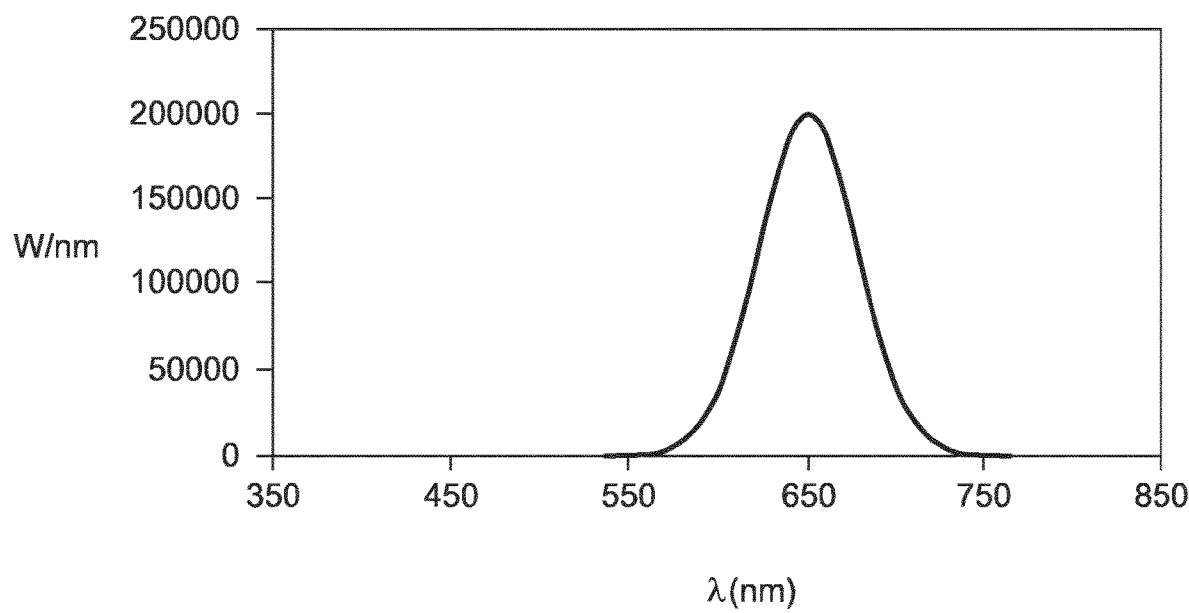
FIGS. 6a-6d show emission spectra of InP QD, CdSe Qd, CdTe QD, and CdTe QD (larger particles than the former).
Figure 6B:
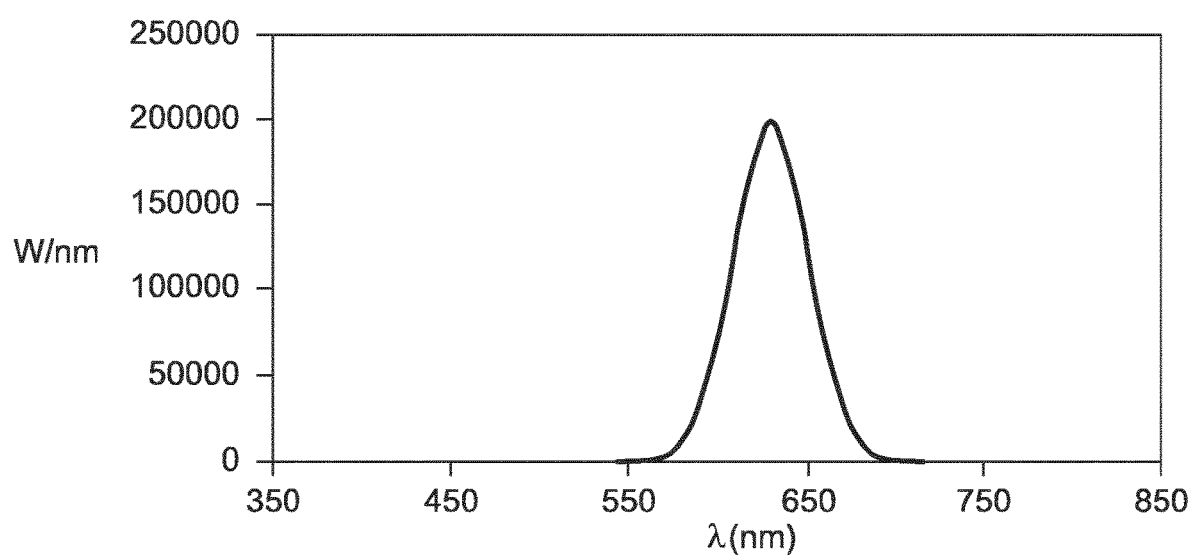
Figure 6C:
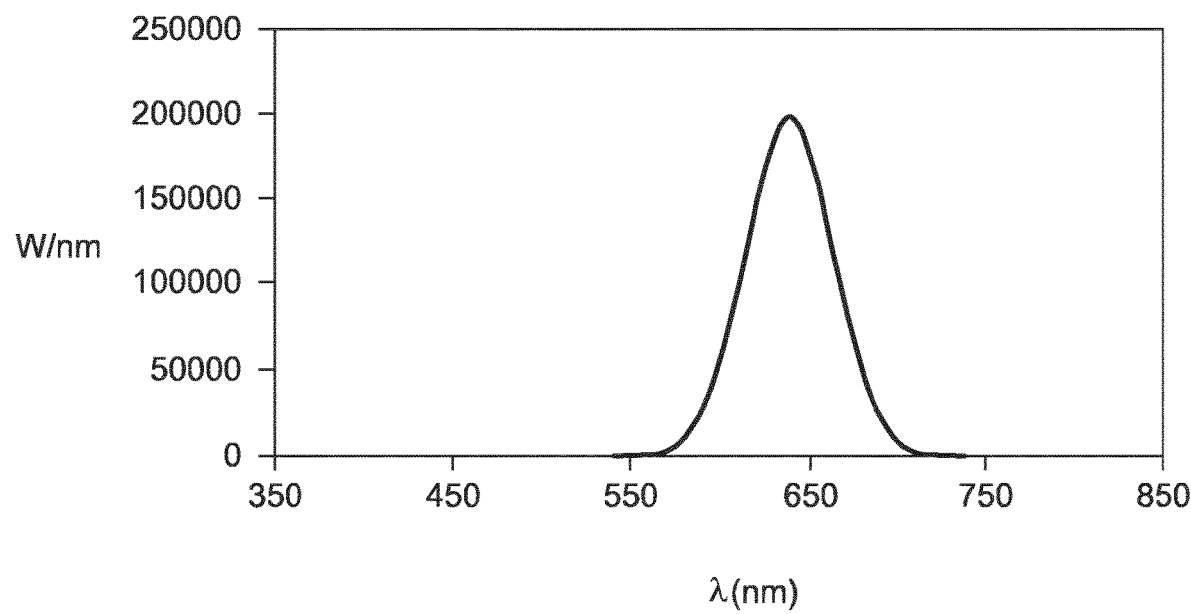
Figure 6D:
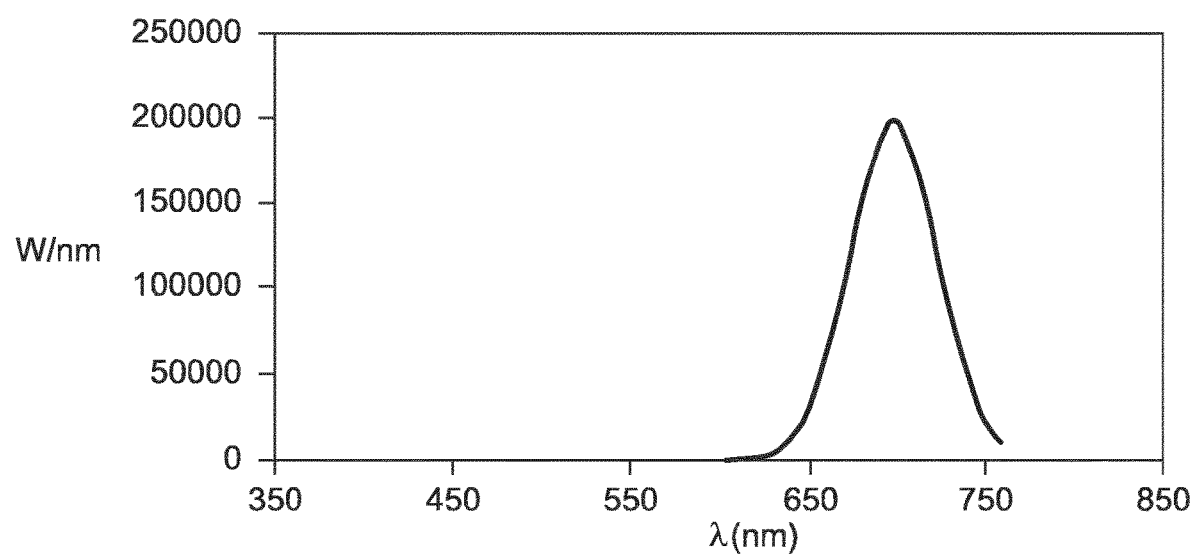

FIGS. 6a-6d show emission spectra upon excitation at 600 nm, with emission at about 650 nm for InP (FIG. 6a), energy loss is 8.2%, with emission at about 630 nm for CdSe (FIG. 6b), energy loss is 5%, and with emission at about 640 nm for CdTe (FIG. 6c), with energy loss is 6.4%. FIG. 6d shows an example where the difference between pump peak maximum (600 nm) and emission maximum is substantially larger. Here, the emission is at 700 nm; the quantum dots are CdTe. The energy loss is 14.4%. The QDs in FIGS. 6c and 6d have particles sizes of about 4.4 and 5 nm, respectively. No pump emission is visible when the absorbance of the quantum dots is high enough, e.g. when the concentration of quantum dots in a matrix is high enough or the layer thickness of the QD material is thick enough.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising:
   a solid-state-based light source configured to generate light source light having a peak maximum; and
   a luminescent material positioned downstream from the solid-state-based light source and configured to convert at least part of the light source light into luminescent material light;
   wherein the luminescent material light includes an emission band in the visible part of the spectrum which represents at least 80% of the total power of the luminescent material light in the visible part of the spectrum, the emission band having a full width half maximum of at maximum 60 nm, and the emission band having a peak maximum;
   wherein the wavelength of the peak maximum of the light source light subtracted from the wavelength of the peak maximum of the emission band is great-than-or-equal to 0 nm and less-than-or-equal to 60 nm; and
   wherein the lighting device is configured to provide the luminescent material light with a radiance of at least 2 W/(sr·mm$^2$).

2. The lighting device according to claim 1, further comprising a converter comprising the luminescent material, wherein the solid-state-based light source and the luminescent material are selected to provide the luminescent material light with an energy conversion loss of at maximum 13%, and wherein the wavelength of the peak maximum of the light source light subtracted from the wavelength of the peak maximum of the emission band is greater-than-or-equal-to 5 nm and less-than-or-equal to 30 nm.

3. The lighting device according to claim 1, further comprising a converter comprising the luminescent material and a converter surface, wherein the lighting device is configured to provide the light source light to the converter surface with a power of at least 1 W/cm$^2$.

4. The lighting device according to claim 1, wherein the solid-state-based light source comprises a laser.

5. The lighting device according to claim 1, further comprising a luminescent concentrator comprising the luminescent material.

6. The lighting device according to claim 1, further comprising a spot of luminescent material, wherein the spot has an area of at maximum 1 mm$^2$.

7. The lighting device according to claim 1, wherein the luminescent material comprises luminescent quantum dots based on one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe type quantum dots.

8. The lighting device according to claim 1, wherein the luminescent material comprises luminescent quantum dots based on one or more of CdSe and CdS.

9. The lighting device according to claim 1, wherein the luminescent material comprises luminescent quantum dots based on one or more of InP, CuInS$_2$ and AgInS$_2$ type quantum dots.

10. The lighting device according to claim 1, wherein the luminescent material has a Stokes shift, less-than-or-equal-to 60 nm.

11. The lighting device according to claim 1, wherein the solid-state-based light source and the luminescent material are selected to provide the luminescent material light with an energy conversion loss of at maximum 10%.

12. A lighting apparatus comprising the lighting device according to claim 1.

13. The lighting apparatus according to claim 12, further comprising one or more further lighting devices, wherein the lighting device and the one or more further lighting devices are configured to provide white light.

14. The lighting apparatus according to claim 13, wherein the one or more further lighting devices comprise.

15. The lighting device according to claim 1, wherein the lighting device is configured to generate lighting device light, the lighting device light comprising the luminescent material light and some of the light source light.

16. The lighting device according to claim 15, wherein 80% or more of the power of the light source light is from the luminescent material light.

17. The lighting device according to claim 1, further comprising a light exit window positioned downstream from the solid-state-based light source.

18. The lighting device according to claim 17, wherein the light exit window comprises a light transmissive solid material.

19. The lighting device according to claim 17, wherein the luminescent material is positioned upstream of the light exit window.

20. The lighting device according to claim 17, wherein the light exit window comprises the luminescent material.

* * * * *